(12) United States Patent
Zamir et al.

(10) Patent No.: US 10,116,333 B2
(45) Date of Patent: Oct. 30, 2018

(54) DECODER WITH PARALLEL DECODING PATHS

(71) Applicant: SANDISK TECHNOLOGIES LLC, Plano, TX (US)

(72) Inventors: Ran Zamir, Ramat Gan (IL); Alexander Bazarsky, Holon (IL); Stella Achtenberg, Netanya (IL); Omer Fainzilber, Even Yehuda (IL); Eran Sharon, Rishon Lezion (IL)

(73) Assignee: SANDISK TECHNOLOGIES LLC, Addison, TX (US)

( * ) Notice: Subject to any disclaimer, the term of this patent is extended or adjusted under 35 U.S.C. 154(b) by 55 days.

(21) Appl. No.: 15/223,531

(22) Filed: Jul. 29, 2016

(65) Prior Publication Data

US 2018/0034477 A1 Feb. 1, 2018

(51) Int. Cl.
| | | |
|---|---|---|
| *H03M 13/11* | (2006.01) |
| *G11C 16/08* | (2006.01) |
| *G06F 11/10* | (2006.01) |
| *H03M 13/00* | (2006.01) |
| *G11C 16/16* | (2006.01) |

(Continued)

(52) U.S. Cl.
CPC ..... *H03M 13/1108* (2013.01); *G06F 11/1076* (2013.01); *G11C 16/08* (2013.01); *H03M 13/1105* (2013.01); *H03M 13/116* (2013.01); *H03M 13/1111* (2013.01); *H03M 13/1131* (2013.01); *H03M 13/6561* (2013.01); *G11C 11/5628* (2013.01); *G11C 11/5642* (2013.01); *G11C 16/0483* (2013.01); *G11C 16/10* (2013.01); *G11C 16/16* (2013.01); *G11C 16/26* (2013.01); *H03M 13/1171* (2013.01)

(58) Field of Classification Search
CPC .................................................. H03M 13/1108
See application file for complete search history.

(56) References Cited

U.S. PATENT DOCUMENTS 8,234,555 B2 * 7/2012 Yokokawa ......... H03M 13/1111
714/786
8,677,225 B1 * 3/2014 Weiner ................ G06F 11/1012
714/800

(Continued)

OTHER PUBLICATIONS

X. Wu, C. Zhao and X. You, "Parallel Weighted Bit-Flipping Decoding," in IEEE Communications Letters, vol. 11, No. 8, pp. 671-673, Aug. 2007.*

(Continued)

*Primary Examiner* — Steve N Nguyen
(74) *Attorney, Agent, or Firm* — Michael Best & Friedrich LLP

(57) ABSTRACT

A device includes a memory configured to store syndromes, a first data processing unit coupled to the memory, and a second data processing unit coupled to the memory. The first data processing unit is configured to process a first value corresponding to a first symbol of data to be decoded. The second data processing unit is configured to process a second value corresponding to a second symbol of the data. Syndrome aggregation circuitry is coupled to the first data processing unit and to the second data processing unit. The syndrome aggregation circuitry is configured to combine syndrome change decisions of the first data processing unit and the second data processing unit.

20 Claims, 6 Drawing Sheets

(51) Int. Cl.
   *G11C 16/26* (2006.01)
   *G11C 16/10* (2006.01)
   *G11C 11/56* (2006.01)
   *G11C 16/04* (2006.01)

(56) References Cited

U.S. PATENT DOCUMENTS

| | | | |
|---|---|---|---|
| 9,755,667 B1 * | 9/2017 | Chen | H03M 13/3746 |
| 2009/0113276 A1 * | 4/2009 | Radosavljevic | H03M 13/1137 |
| | | | 714/801 |
| 2011/0173510 A1 | 7/2011 | Andreev et al. | |
| 2011/0200149 A1 * | 8/2011 | Choi | H03M 13/114 |
| | | | 375/341 |
| 2012/0185744 A1 | 7/2012 | Varnica et al. | |
| 2013/0212450 A1 * | 8/2013 | Sham | H03M 13/1137 |
| | | | 714/773 |
| 2014/0325310 A1 * | 10/2014 | Anholt | G06F 11/1072 |
| | | | 714/764 |
| 2015/0229330 A1 * | 8/2015 | Motozuka | H03M 13/1105 |
| | | | 714/752 |
| 2016/0336964 A1 * | 11/2016 | Khalil | H03M 13/114 |

OTHER PUBLICATIONS

G. Li and G. Feng, "Improved parallel weighted bit-flipping decoding algorithm for LDPC codes," in IET Communications, vol. 3, No. 1, pp. 91-99, Jan. 2009.*

Zamir et al., U.S. Appl. No. 14/924,249, entitled "Pipelined Decoder with Syndrome Feedback Path," filed Oct. 27, 2015, 33 pages.

* cited by examiner

DECODER WITH PARALLEL DECODING PATHS

FIELD OF THE DISCLOSURE

This disclosure is generally related to error correction coding (ECC) decoders.

BACKGROUND

Non-volatile storage devices, such as flash memory devices, have enabled increased portability of data and software applications. For example, flash memory devices can enhance data storage density by storing multiple bits in each cell of the flash memory. To illustrate, Multi-Level Cell (MLC) flash memory devices provide increased storage density by storing 3 bits per cell, 4 bits per cell, or more. Electronic devices, such as mobile phones, typically use non-volatile storage devices, such as flash memory devices, for persistent storage of information, such as data and program code that is used by the electronic device. Advances in technology have resulted in increased storage capacities of non-volatile storage devices with reductions in storage device size and cost.

To correct data errors, a flash memory device may utilize an error correcting code (ECC) technique. For example, the flash memory device may encode user data using an ECC technique to generate encoded data, such as an ECC codeword. The encoded data may be stored at the flash memory device and may be decoded by a decoder of the flash memory device, such as in response to a request for read access to the data from a host device that accesses the flash memory device.

The flash memory device may use a low-density parity check (LDPC) decoding technique to decode the data. The LDPC decoding technique may use a parity check matrix to decode an ECC codeword, such as by multiplying the parity check matrix and the ECC codeword to generate "decoded" data. Because the ECC codeword includes parity bits that satisfy a set of parity equations specified by the parity check matrix, one or more bit errors in the ECC codeword can be corrected using the LDPC decoding technique.

An LDPC decoding operation may be performed (or represented) using variable nodes and check nodes. The variable nodes may represent bit values of the ECC codeword, and the check nodes may represent the parity equations of the parity check matrix. Each variable node may be connected to one or more of the check nodes. The connections between variable nodes and check nodes (or "constraints") may represent the set of parity equations specified by the parity check matrix. If bit values of decoded data satisfy the set of parity equations, then the decoded data is "correct" (e.g., has been successfully decoded).

Latency associated with LDPC computations may be reduced by increasing a number of variable nodes that are processed in parallel at a decoder. Coding techniques such as quasi-cyclic (QC)-LDPC coding results in groups of variable nodes, where all variable nodes within a group have no interdependencies with each other and therefore may be processed in parallel with each other. Although parallelism increases as the size of the groups increases, the number of groups in a codeword decreases with increasing group size, which can weaken the error correction capacity of the encoding scheme.

DETAILED DESCRIPTION

Particular aspects of the present disclosure are described below with reference to the drawings. In the description, common features are designated by common reference numbers. Although certain examples are described herein with reference to a data storage device, it should be appreciated that techniques described herein are applicable to other implementations. Further, it is to be appreciated that certain ordinal terms (e.g., "first" or "second") may be provided for ease of reference and do not necessarily imply physical characteristics or ordering. Therefore, as used herein, an ordinal term (e.g., "first," "second," "third," etc.) used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") may indicate "one or more" rather than "one." Further, an operation performed "based on" a condition or event may also be performed based on one or more other conditions or events not explicitly recited. As used herein, "examplary" may indicate an example, an implementation, and/or an aspect, and should not be construed as limiting or as indicating a preference or a preferred example, implementation, and/or aspect.

The present disclosure describes systems and methods of ECC decoding of data using parallel decoding paths. Interdependencies between one portion of the data processed at one decoding path and another portion of the data processed at another decoding path may be resolved via syndrome aggregation. For example, when decode processing of the first portion of the data indicates that a particular syndrome value is to be updated and the parallel processing of the second portion of the data also indicates that the particular syndrome value is to be updated, the particular syndrome may be updated based on the aggregate of such indications. Selection of portions of the data to be decoded in parallel with each other may be based on one or more metrics such as estimated reliability of the portions to be decoded and interdependencies between the portions, as described further with reference to FIGS. 1-3.

Figure 1:
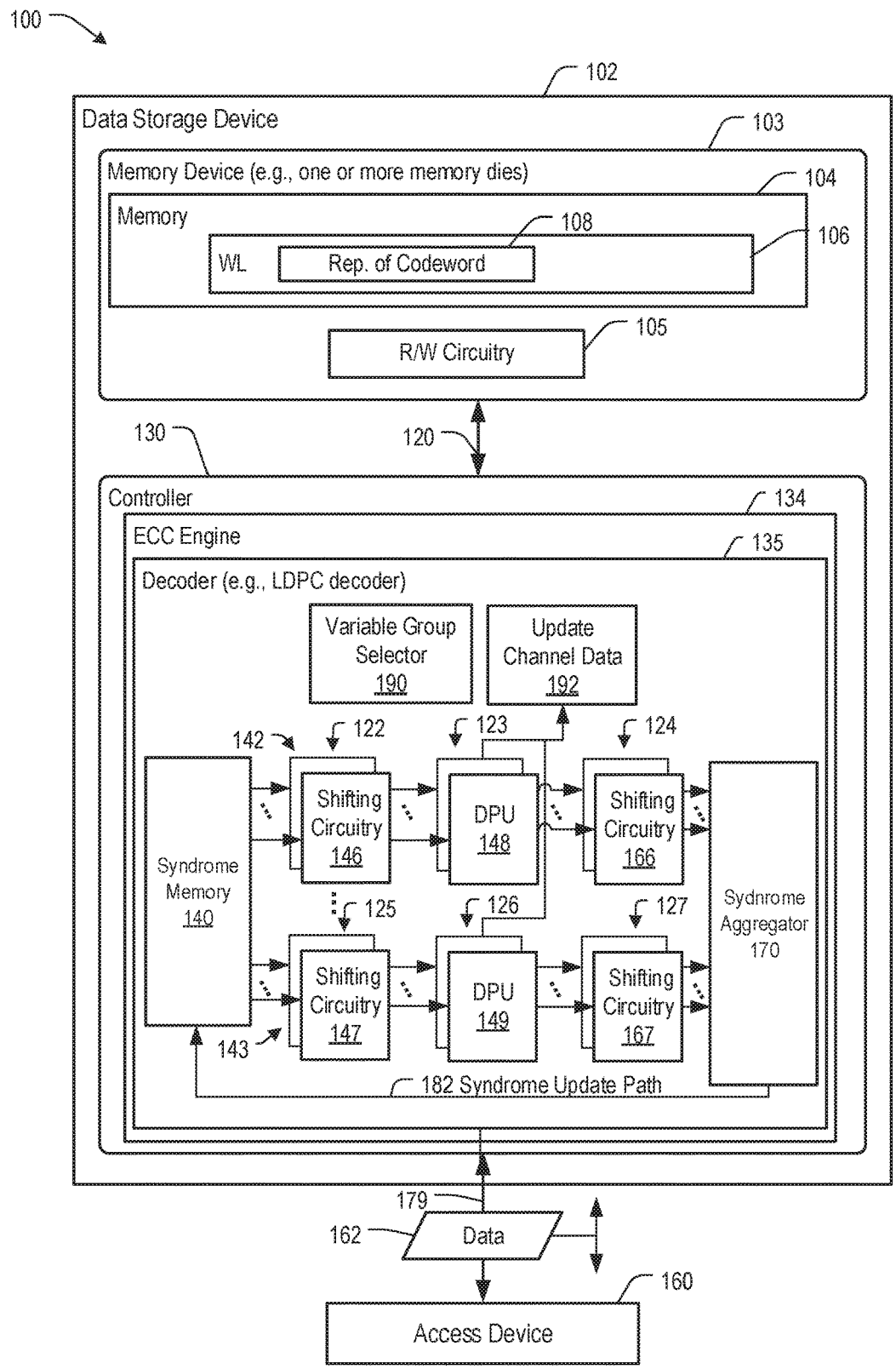
FIG. 1 is a block diagram of a particular illustrative example of a system including a data storage device that includes an ECC decoder with parallel decoding paths.

FIG. 1 depicts an illustrative example of a system 100 that includes a data storage device 102 and an access device 160. The data storage device 102 includes a controller 130 (e.g., a memory controller) and a memory device 103 that is coupled to the controller 130. The memory device 103 may include one or more memory dies. The controller 130 includes an error correction coding (ECC) decoder 135 that is configured, during decoding of a representation 108 of a codeword from the non-volatile memory of the memory device 103, to decode different portions of the representation 108 in parallel at a first decoding path 142 and a second decoding path 143. Interdependencies between the portions of the representation 108 that are decoded in parallel at the different decoding paths 142-143 may be resolved at a syndrome aggregator 170. Decode processing at the multiple decoding paths 142-143 and resolving interdependencies at the syndrome aggregator 170 enables increased decoder parallelism and reduced decoder latency as compared to a decoder that is limited to parallel processing of portions of data without interdependencies.

The data storage device 102 and the access device 160 may be coupled via a connection (e.g., a communication path 179), such as a bus or a wireless connection. The data storage device 102 may include a first interface (e.g., an accessing device interface) that enables communication via the communication path 179 between the data storage device 102 and the access device 160.

In some implementations, the data storage device 102 may be embedded within the access device 160, such as in accordance with a Joint Electron Devices Engineering Council (JEDEC) Solid State Technology Association Universal Flash Storage (UFS) configuration. For example, the data storage device 102 may be configured to be coupled to the access device 160 as embedded memory, such as eMMC® (trademark of JEDEC Solid State Technology Association, Arlington, Virginia) and eSD, as illustrative examples. To illustrate, the data storage device 102 may correspond to an eMMC (embedded MultiMedia Card) device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). Alternatively, the data storage device 102 may be removable from the access device 160 (i.e., "removably" coupled to the access device 160). As an example, the data storage device 102 may be removably coupled to the access device 160 in accordance with a removable universal serial bus (USB) configuration.

In some implementations, the data storage device 102 may include or correspond to a solid state drive (SSD) which may be included in, or distinct from (and accessible to), the access device 160. For example, the data storage device 102 may include or correspond to an SSD, which may be used as an embedded storage drive (e.g., a mobile embedded storage drive), an enterprise storage drive (ESD), a client storage device, or a cloud storage drive, as illustrative, non-limiting examples. In some implementations, the data storage device 102 is coupled to the access device 160 indirectly, e.g., via a network. For example, the network may include a data center storage system network, an enterprise storage system network, a storage area network, a cloud storage network, a local area network (LAN), a wide area network (WAN), the Internet, and/or another network. In some implementations, the data storage device 102 may be a network-attached storage (NAS) device or a component (e.g., a solid-state drive (SSD) device) of a data center storage system, an enterprise storage system, or a storage area network.

The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof. In some implementations, the data storage device 102 and the access device 160 may be configured to communicate using one or more protocols, such as an eMMC protocol, a universal flash storage (UFS) protocol, a universal serial bus (USB) protocol, a serial advanced technology attachment (SATA) protocol, and/or another protocol, as illustrative, non-limiting examples.

The access device 160 may include a memory interface (not shown) and may be configured to communicate with the data storage device 102 via the memory interface to read data from and write data to the memory device 103 of the data storage device 102. For example, the access device 160 may operate in compliance with a Joint Electron Devices Engineering Council (JEDEC) industry specification, such as a Universal Flash Storage (UFS) Access Controller Interface specification. As other examples, the access device 160 may operate in compliance with one or more other specifications, such as a Secure Digital (SD) Access Controller specification, as an illustrative, non-limiting example. The access device 160 may communicate with the memory device 103 in accordance with any other suitable communication protocol.

The access device 160 may include a processor and a memory. The memory may be configured to store data and/or instructions that may be executable by the processor. The memory may be a single memory or may include multiple memories, such as one or more non-volatile memories, one or more volatile memories, or a combination thereof. The access device 160 may issue one or more commands to the data storage device 102, such as one or more requests to erase data, to read data from, or to write data to the memory device 103 of the data storage device 102. For example, the access device 160 may be configured to provide data, such as data 162, to be stored at the memory device 103 or to request data to be read from the memory device 103. The access device 160 may include a mobile telephone, a computer (e.g., a laptop, a tablet, or a notebook computer), a music player, a video player, a gaming device or console, an electronic book reader, a personal digital assistant (PDA), a portable navigation device, a network computer, a server, any other electronic device, or any combination thereof, as illustrative, non-limiting examples.

The memory device 103 of the data storage device 102 may include one or more memory dies (e.g., one memory die, two memory dies, eight memory dies, or another number of memory dies). The memory device 103 includes a memory 104, such as a non-volatile memory of storage elements included in a memory die of the memory device 103. For example, the memory 104 may include a flash memory, such as a NAND flash memory, or a resistive memory, such as a resistive random access memory (ReRAM), as illustrative, non-limiting examples. In some implementations, the memory 104 may include or correspond to a memory die of the memory device 103. The memory 104 may have a three-dimensional (3D) memory configuration. As an example, the memory 104 may have a 3D vertical bit line (VBL) configuration. In a particular implementation, the memory 104 is a non-volatile memory having a 3D memory configuration that is monolithically formed in one or more physical levels of arrays of memory cells having an active area disposed above a silicon substrate. Alternatively, the memory 104 may have another configuration, such as a two-dimensional (2D) memory configuration or a non-monolithic 3D memory configuration (e.g., a stacked die 3D memory configuration).

The memory 104 may include one or more blocks of storage elements (e.g., also referred to herein as memory cells). For example, each of the blocks may include a NAND flash erase block. Each storage element of the memory 104 may be programmable to a state (e.g., a threshold voltage in a flash configuration or a resistive state in a resistive memory configuration) that indicates one or more values. Each block of the memory 104 may include one or more word lines, such as a representative word line (WL) 106. Although the memory 104 is illustrated as including a single representative word line, in other implementations, the memory 104 may include any number of word lines. Each word line may include one or more pages, such as one or more physical pages. A word line may be configurable to operate as a single-level-cell (SLC) word line, as a multi-level-cell (MLC) word line, or as a tri-level-cell (TLC) word line, as illustrative, non-limiting examples.

The memory device 103 may include support circuitry, such as read/write (R/W) circuitry 105, to support operation of one or more memory dies of the memory device 103. Although depicted as a single component, the read/write circuitry 105 may be divided into separate components of the memory device 103, such as read circuitry and write circuitry. The read/write circuitry 105 may be external to the one or more dies of the memory device 103. Alternatively, one or more individual memory dies of the memory device 103 may include corresponding read/write circuitry that is operable to read data from and/or write data to storage elements within the individual memory die independent of any other read and/or write operations at any of the other memory dies.

The memory device 103 may be coupled via a bus 120 to the controller 130. For example, the bus 120 may include one or more channels to enable the controller 130 to communicate with a single memory die of the memory device 103. As another example, the bus 120 may include multiple distinct channels to enable the controller 130 to communicate with each memory die of the memory device 103 in parallel with, and independently of, communication with other memory dies of the memory device 103.

The controller 130 is configured to receive data and instructions from the access device 160 and to send data to the access device 160. For example, the controller 130 may send data to the access device 160 via the communication path 179, and the controller 130 may receive data from the access device 160 via the communication path 179. The controller 130 is configured to send data and commands to the memory 104 and to receive data from the memory 104. For example, the controller 130 is configured to send data and a write command to cause the memory 104 to store data to an address of the memory 104. The write command may specify a physical address of a portion of the memory 104 (e.g., a physical address of a word line of the memory 104) that is to store the data. The controller 130 may also be configured to send data and commands to the memory 104 associated with background scanning operations, garbage collection operations, and/or wear leveling operations, etc., as illustrative, non-limiting examples. The controller 130 is configured to send a read command to the memory 104 to access data from a specified address of the memory 104. The read command may specify the physical address of a portion of the memory 104 (e.g., a physical address of a word line of the memory 104).

The controller 130 includes an error correction code (ECC) engine 134. The ECC engine 134 may include an encoder configured to encode one or more data words using an ECC encoding technique. The ECC engine 134 may include a Reed-Solomon encoder, a Bose-Chaudhuri-Hocquenghem (BCH) encoder, a low-density parity check (LDPC) encoder, a turbo encoder, an encoder configured to encode the data according to one or more other ECC techniques, or a combination thereof, as illustrative, non-limiting examples. The ECC engine 134 also includes the decoder 135. The decoder 135 is configured to decode data read from the memory 104 to detect and correct, up to an error correction capability of the ECC scheme, bit errors that may be present in the data. The decoder 135 may include a relatively low-power, high-speed decoder (e.g., a bit-flipping decoder), a full-power LDPC decoder with a higher correction capacity than the lower-power decoder, one or more other decoders, or a combination thereof.

The decoder 135 may be configured to perform an iterative low-power decoding operation on received data, such as the representation 108 of the codeword that is read from the memory 104. To illustrate, the representation 108 may match a valid codeword of an ECC scheme or may differ from the valid codeword due to one or more errors (e.g., due to data retention or disturb effects in the memory 104). The decoder 135 may map symbols (e.g., bits) of the representation 108 to variable nodes of a bipartite graph that corresponds to the ECC scheme and may selectively change the symbols based on how many unsatisfied parity checks that each symbol participates in, such as described in further detail with reference to FIG. 2.

For example, the decoder 135 may select a first variable node corresponding to a first symbol of a codeword to be decoded and may determine whether to change the symbol based on how many unsatisfied parity check equations the first symbol participates in. After determining whether to change the symbol, the decoder 135 updates any syndromes that are affected by the change in the symbol and continues with processing a next symbol of the codeword. Processing may continue until all parity checks have been satisfied (e.g., all syndromes are '0'), indicating a successful convergence to a valid codeword.

To illustrate, in a binary LDPC implementation, each symbol is a single bit and each syndrome is a single bit. A number of non-zero syndromes (e.g., representing unsatisfied parity check equations) associated with a symbol may be compared to a threshold, and if the number of non-zero syndromes equals or exceeds the threshold, the symbol bit may be changed (e.g., "flipped"). Although a binary LDPC implementation is described herein, in other implementations, the decoder 135 may be configured to perform decoding of non-binary codewords (e.g., decoding multi-bit symbols based on multi-bit syndromes).

If all variable nodes are processed and one or more parity check equations remain unsatisfied (e.g., one or more syndromes is '1'), the decoder 135 may be configured to repeat processing one or more times, up to a threshold number of decoding iterations. In case the decoder 135 has not converged within the threshold number of decoding iterations, the ECC engine 134 may initiate decoding using a decoder with a higher correction capability.

The decoder 135 includes the first decoding path 142 and the second decoding path 143 in parallel with the first decoding path 142. A syndrome aggregator 170 is coupled to the outputs of the first decoding path 142 and the second decoding path 143. The syndrome aggregator 170 is coupled to a memory 140 via a syndrome update path 182.

The memory 140 (also referred to as syndrome memory 140) is configured to store syndromes during a decoding operation. For example, the memory 140 may include any type of memory, such as a static random access memory (SRAM) or a register file, as illustrative, non-limiting examples. The memory 140 may store values of parity check equations that may be accessed during each cycle of a decoding operation of the decoder 135. To illustrate, syndrome(s) associated with one or more variable nodes to be processed during a particular cycle may be provided to the decoding paths 142-143. Syndromes to be updated (e.g., based on determining that a processed variable node has changed value during the cycle) may be altered at the memory 140 in response to receiving syndrome change information via the syndrome update path 182.

The first decoding path 142 includes a set of shifting circuitry 122 including shifting circuitry 146, a set of data processing units (DPUs) 123 including a first DPU 148, and a set of shifting circuitry 124 including shifting circuitry 166. The second processing path 143 includes a set of shifting circuitry 125 including shifting circuitry 147, a set of DPUs 126 including a second DPU 149, and a set of shifting circuitry 127 including shifting circuitry 167. The decoder 135 is configured to perform decoding operations at the first decoding path 142 of one or more variable nodes in parallel with performing decoding operations at the second decoding path 143 for one or more other variable nodes. The variable nodes processed at the first decoding path 142 and the second decoding path 143 may have interdependencies. For example, at least one syndrome of the codeword being decoded may have a value that is determined based on at least a first variable node of a first group of variable nodes processed in the first processing path 142 and at least a second variable node of a second group of variable nodes processed at the second processing path 143. Adjusting the value of the syndrome may also affect values of the first variable node and the second variable node (and may affect values of one or more other variable nodes) in subsequent variable processing decisions.

The set of shifting circuitry 122 is configured to apply a first shift operation to first syndrome data based on a parity check matrix corresponding to the representation 108 and to apply a second shift operation to second syndrome data based on the parity check matrix. For example, the shifting circuitry 146 may be configured to receive a set of syndromes and to apply a circular shift operation to align the set of syndromes to the DPUs of the set of DPUs 123. The shifted syndrome(s) are output to the set of DPUs 123.

The set of DPUs 123 is configured to generate change symbols corresponding to symbols of a portion of a codeword. For example, the first DPU 148 is configured to generate a change signal corresponding to a symbol of a codeword. The change signal is generated based on a set of syndromes associated with the symbol. For example, the change signal may indicate a change to the symbol, such as when the first DPU 148 determines that a bit corresponding to a particular variable node is to be flipped. To illustrate, the first DPU 148 may determine that a bit is to be flipped based on a count of satisfied or unsatisfied parity check equations that a particular variable node participates in exceeding a threshold. The change signal may indicate that each syndrome corresponding to a parity check equation that the bit participates in is to be updated.

The change signal may be shifted by the set of shifting circuitry 124 and provided to the syndrome aggregator 170. For example, the shifting circuitry 166 is configured to apply a shift operation to the change signal to generate a shifted change signal. The shift operation applied by the shifting circuitry 166 may be configured to reverse or "unshift" the shift operation that was applied by the shifting circuitry 146.

Components of the second decoding path 143 may operate in a substantially similar manner as described with reference to corresponding components of the first decoding path 142. For example, the set of shifting circuitry 125 including the shifting circuitry 147 may operate in a similar manner as the set of shifting circuitry 122, the set of DPUs 126 including the second DPU 149 may operate in a similar manner as the set of DPUs 123, and the set of shifting circuitry 127 including the shifting circuitry 167 may operate in a similar manner as the set of shifting circuitry 124.

To accommodate interdependencies between variable nodes processed in the first decoding path 142 and in the second decoding path 143, the syndrome aggregator 170 is configured to combine syndrome change decisions of DPUs of the set of DPUs 123 and of the set of DPUs 126, such as syndrome change decisions of the first DPU 148 and the second DPU 149. For example, when a first syndrome change decision of the first DPU 148 indicates that a particular syndrome is to be changed, and a second syndrome change decision of the second DPU 149 also indicates that the same particular syndrome is to be changed, the syndrome aggregator 170 may combine the two change decisions, which may cancel each other out to result in no change to the particular syndrome. Although the decoder 135 illustrated in FIG. 1 as shown having two parallel decoding paths 142, 143, in other implementations the decoder 135 may include three or more decoding paths. In such implementations, the syndrome aggregator 170 may be configured to aggregate syndrome change decisions of all DPUs having an output that affects each particular syndrome. The syndrome aggregation circuitry (i.e., the syndrome aggregator 170) is further configured to provide the combined syndrome change decisions to the syndrome memory 140 via the syndrome update path 182.

The decoder 135 includes a variable group selector circuit 190. The variable group selector circuit 190 is configured to select a first variable node and a second variable node for concurrent processing. For example, the first variable node may be selected to process at the first DPU 148 as part of a first group of variable nodes and the second variable node may be selected to process at the second DPU 149 as part of a second group of variable nodes. The variable group selector circuit 190 may be responsive to a first metric that corresponds to an amount of interdependencies between variable nodes. For example, the first metric may correspond to a static metric that reduces or minimizes the amount of interdependencies between variable nodes that are selected for parallel processing. The first metric may be described as "static" because it does not depend on the specific data or errors in the decoding and may instead depend only on the chosen code. As another example, the variable group selector circuit 190 may be responsive to a second metric corresponding to a variable reliability measure. For example, one or more dynamic metrics may be used, such as an "instantaneous" reliability measure. To illustrate, the number of unsatisfied parity checks associated with a variable from the previous iteration may be used as an instantaneous reliability measure for the variable (e.g., a low number of unsatisfied parity checks may correspond to higher reliability, and a high number of unsatisfied parity checks may correspond to lower reliability). The variable group selector circuit 190 may be configured to avoid parallel processing of multiple groups of variable nodes having low reliability to increase an average speed of flip decision propagations through decoding iterations of the decoder 135.

The decoder 135 further includes an update channel data 192. The update channel data 192 may include one or more data elements, such as an updated syndrome weight value that is updated based on hard bit values corresponding to each of the variable nodes, one or more other values, or a combination thereof. The update channel data 192 may also include memory to store updated values corresponding to variable nodes that have been processed by the first decoding path 142 or the second decoding path 143.

During operation, the controller 130 may receive a request from the access device 160 to retrieve data that is stored at the word line 106. The controller 130 may receive the representation 108 of the codeword from the memory 104 and may provide the representation 108 to the ECC engine 134. The controller 130 may indicate to the ECC engine 134 an ECC scheme that was used for encoding the data, such as by identifying an LDPC code.

The ECC engine 134 may populate registers or other memory with bit values corresponding to variable nodes and may generate an initial set of syndromes in the memory 140 based on the indicated ECC scheme. In response to determining that at least one syndrome is non-zero, the ECC engine 134 may initiate a decoding operation at the decoder 135.

A decoding operation may include performing one or more decoding iterations. Bit values corresponding to the variable nodes may be logically divided into groups of bit values that can processed in parallel. During each decoding iteration, the groups of bit values are processed in parallel at the decoding paths 142-143, (e.g., two groups at a time when the decoder 135 includes two decoding paths 142-143) and syndrome values are updated in response to individual bit values being modified. After completion of processing of all the groups of bit values, if the syndrome values indicate one or more errors remain, a next decoding iteration may be performed.

During a first decoding cycle of a decoding iteration, the variable group selector circuit 190 may select a first group of bits of the data to be decoded (e.g., a sequentially first group of bits of the representation 108, corresponding to a first group of variable nodes) and a second group of bits of the data to be decoded. The variable group selector circuit 190 may access data corresponding to the ECC scheme, such as from a read-only memory (ROM) or other memory of the controller 130, and may determine which syndromes are to be retrieved for the selected groups of bits, such as by identifying row indices of non-zero values in a column of a parity check matrix that corresponds to the selected groups of bits. An indication of the syndromes to be retrieved may be provided to the memory 140.

The set of shifting circuitry 122 performs a first shift operation to received syndromes based on a control signal that may be received from the variable group selector circuit 190. For example, when the ECC scheme corresponds to a quasi-cyclic LDPC (QC-LDPC) code, a parity check matrix for the QC-LPDC code may include multiple sub-matrices that are either cyclically shifted versions of the identity matrix or zero matrices. The variable group selector circuit 190 may identify, for each syndrome retrieved from the memory 140 for processing the first group of bits, a shift amount to be applied to the syndrome, such as a shift amount of a circular bit-shift operation, to align the syndrome with designated inputs of DPUs of the set of DPUs 123 or with designated inputs of DPUs of the set of DPUs 126. The detection circuit 180 may send a signal to the set of shifting circuitry 122 and the set of shifting circuitry 125 to indicate the identified shift amount(s). Although the set of shifting circuitry 122 and the set of shifting circuity 123 are described as applying shift operations, it should be understood that, for some syndromes, the shift operation may apply a zero shift amount (e.g., no shift is performed).

The set of DPUs 123 receives shifted syndromes and each DPU initiates computations to determine whether to flip the bit corresponding to that DPU's variable node. For example, a summing operation may be performed to determine the number of non-zero syndromes associated with the variable node and a determination of whether the value of the variable node is to be changed (e.g., whether to flip the first bit of the representation 108) is made. The value of the variable node may be selectively changed in response to the determination, and the data processing units generate change signals indicating whether the value of the respective variable nodes have been changed. For example, the change signal may correspond to a multi-bit signal that indicates a change flag for each of the syndrome(s) associated with a variable node. The set of shifting circuitry 124 may apply a shift operation to the change signal (e.g., may apply one or more circular bit shift(s) having a shift amount(s) that is opposite the shift amount(s) applied by the set of shifting circuitry 146) and may output a shifted change signal to the syndrome aggregator 170.

The syndrome aggregator 170 may aggregate (e.g., combine) change signals from the first path 142 and from the second path 143 for syndromes that are associated with a variable node processed at the first decoding path 142 and also with a variable node processed at the second decoding path 143. The memory 140 may update values of syndromes that are stored in the memory 140, such as by applying an XOR operation of the stored syndrome values and the aggregated change signals output by the syndrome aggregator 170 and storing the output of the XOR operation in the memory 140 as updated syndromes.

Decode processing of the remaining variable nodes may continue in a substantially similar manner as described above and may terminate in response to determining that all syndrome values are zero. After terminating decoding when the syndrome values are zero, the decoded data represented by the variable nodes may be provided to the access device 160. Alternatively, if a number of decoding iterations reaches the decoding iteration threshold, decode processing at the decoder 135 may terminate and decoding may be performed at another ECC decoder of the ECC engine 134 that has a higher error correction capability.

The decoder 135 may support an ECC scheme that has a parity check matrix that includes 'm' block rows of size 'z' and 'n' block columns of size z, where each variable node participates in up to 'l' parity check equations, and where m, n, z, and l are positive integers. The set of shifting circuitry 122 and the set of shifting circuitry 124 may each include up to l shifters, with each of the l shifters configured to perform a shift of z syndromes, and the set of DPUs 123 may include up to z pipelined DPUs to process all variable nodes of a block column in parallel.

Table 1 illustrates an example of pseudocode that may be implemented at the decoder 135. In Table 1, C corresponds to the set of check nodes of a codeword (e.g., of the representation 108 of the codeword), V corresponds to the set of variable nodes of the codeword, P corresponds to the number of parallel DPU paths (e.g., the number of decoding paths 142-143), $b_i$ corresponds to the $i^{th}$ bit of the codeword, $s_j$ corresponds to the $j^{th}$ syndrome bit, f corresponds to the syndrome weight, $Thr_i$ corresponds to the flipping threshold for the $i^{th}$ variable, $Dv(v_i)$ corresponds to the column weight of the $i^{th}$ variable node (i.e. the number of check nodes connected to the variable node $v_i$), x corresponds to a syndrome flip decision, and N(v) corresponds to all check nodes connected to variable node v (e.g., v's neighbors).

TABLE 1

Initialization:

for all $c_j \in C : s_j \leftarrow \Sigma_{v_i \in N(c_j)} b_i \bmod 2$, $f = \sum_{c_j \in C} s_j$ Iteration:

for i = 1 : P : |V|
{
　　for p = 0 : P − 1 : // process the P decoding paths in parallel
　　{
　　　　$S_p \leftarrow \sum_{c_j \in N(v_{i+p})} s_j$ if $S_p > Thr_i$
　　　　{
　　　　　　$b_{i+p} = \sim b_{i+p}$
　　　　　　$x_p = 1$
　　　　　　$f = f + Dv(v_{i+p}) − 2S_p$
　　　　}
　　　　else
　　　　　　$x_p = 0$
　　　　end if
　　}
　　//Syndrome Aggregation
　　for all $c_j \in N(v_i, \ldots, v_{i+P-1})$
　　{
　　　　$s_j = s_j \oplus x_p$, for all p = 0, ... P − 1: $v_{i+p} \in N(c_j)$
　　}
　　if f = 0 break (convergence)
}

Table 2 illustrates an example of pseudocode that may be implemented at the syndrome aggregator 170. In Table 2, $s_k$ corresponds to the Z-bit output aggregated syndrome flipping decision for check k, $x_{i,j}$ corresponds to the Z-bit input syndrome flipping decisions from DPU path i, port j, and check(i, j) corresponds to the check number associated with the variable node in the DPU path i, port j.

TABLE 2

$s_k = \begin{cases} \bigoplus x_{i,j}, \text{ for all (i, j): check(i, j) = k,} & \text{check k has interdependencie} \\ x_{i,j}, & \text{check (i, j) = k has no interdependencies} \end{cases}$ Although the decoder 135 is illustrated and described with respect to a bit-flipping technique based on comparing a number of unsatisfied parity check equations to a threshold, on other implementations other techniques may be used. For example, in another implementation the first DPU 148 may include circuitry configured to perform another decoding technique, such as a Gallager-A or Gallager-B technique, as illustrative, non-limiting examples. To illustrate, the first DPU 148 may be configured to make a bit flip decision based on whether a majority of the syndromes associated with the variable node are satisfied or unsatisfied.

By including multiple decoding paths 142-143, multiple groups of variable nodes may be processed in parallel each cycle of the decoding pipeline. In QC-LDPC implementations, each group of variable nodes may correspond to an entire block column of a parity check matrix and the variable nodes of multiple groups of variable nodes may be processed in parallel to provide reduced latency as compared to decoders where variable nodes of a single block column are processed in parallel.

Figure 2:
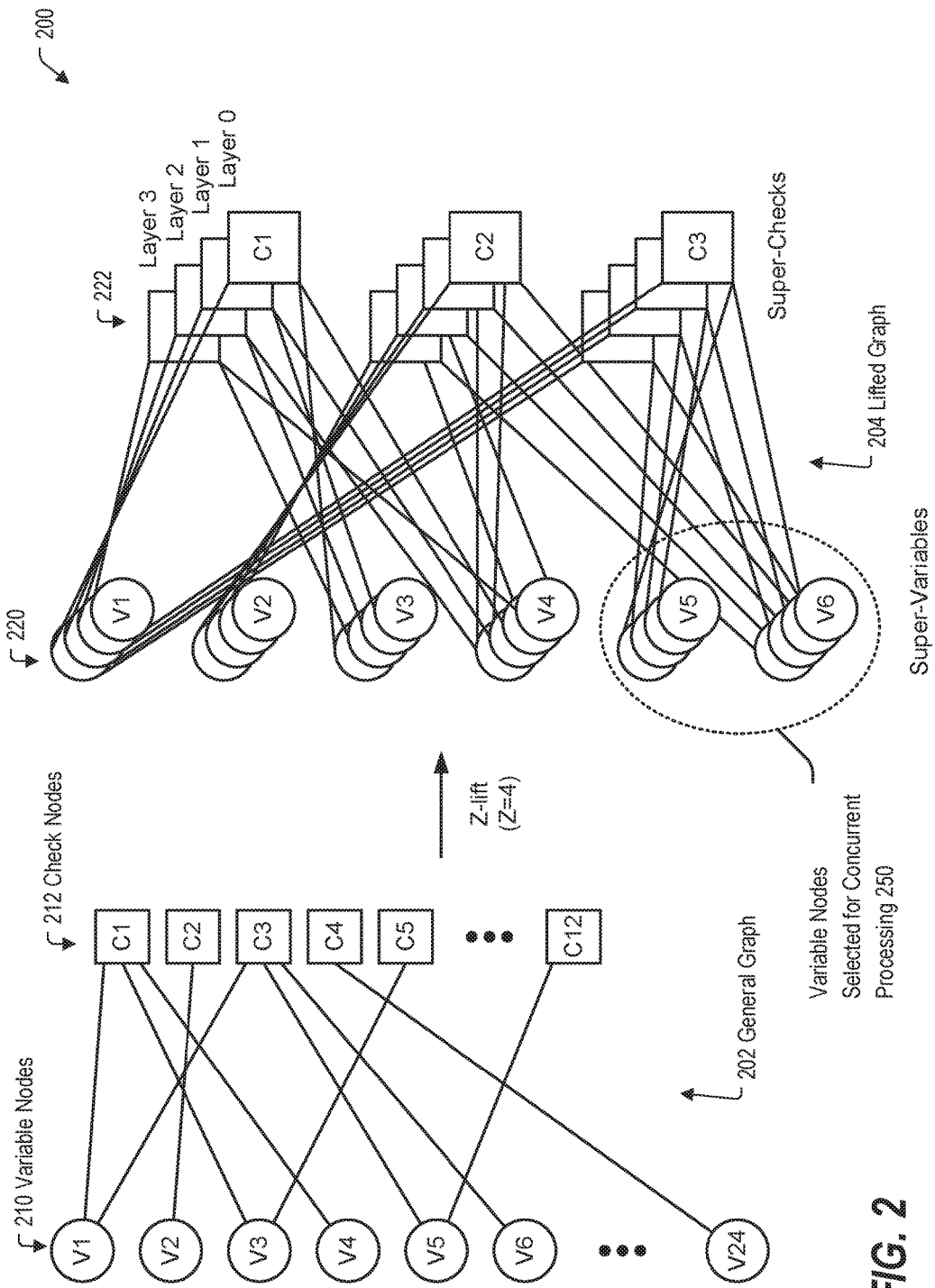
FIG. 2 is a diagram of a particular example of bipartite graphs that may be used by the data storage device of FIG. 1.

Referring to FIG. 2, a particular illustration of bipartite graphs that may be implemented at the decoder 135 of FIG. 1 are depicted and designated 200. A first graph 202 is a general graph that includes a set of variable nodes 210 and a set of check nodes 212. Each line connecting a variable node and check node indicates that the variable node participate in the parity check equation corresponding to the check node. For example, variable nodes V1, V3, and V4 are connected to check node C1 (e.g., C1=V1 XOR V3 XOR V4) and are referred to as "interdependent." In contrast, the check nodes connected to variable node V2 (check node C2) and the check nodes connected to variable node V4 (check node C1) do not have any check nodes in common. Thus, V2 and V4 do not have any interdependencies.

A lifted graph 204 is illustrated based on the general graph 202, where each variable node is duplicated by a lifting factor Z, illustrated as Z=4, to generate a lifted set of variable nodes 220, and each check node of the set of check nodes 212 is duplicated by the lifting factor Z to generate a lifted set of check nodes 222. Variable nodes of the lifted set of variable nodes 220 are grouped as "super-variables" and check nodes of the lifted set of check nodes 222 are grouped as "super-checks."

The variable nodes of each super-variable are coupled to check nodes of one or more super-checks so that the variable nodes within the super-variable do not have any interdependencies (within the super-variable). For example, no two variable nodes within a super-variable are connected to the same check node. Thus, the variable nodes within a super-variable may be processed in parallel without having multiple change signals generated for a single check node.

The super-variables V1 and V4 participate in parity checks of super-check C1 and therefore have interdependencies. For example, the layer 4 variable node of V1 and the layer 2 variable node of V4 are connected to the layer 0 check node of C1. Therefore, a decision to flip the V1 layer 4 bit or the V4 layer 2 bit would also flip the check bit of C1 layer 0, while a decision to flip both the V1 layer 4 bit and the V1 layer 2 bit would have no net effect on the C1 layer 0 check bit. Thus, when the V1 and V4 super-variables are processed concurrently (e.g., in parallel at the first decoding path 142 and the second decoding path 143), the change signals corresponding to processing the V1 layer 4 bit and the V4 layer 2 bit may be aggregated by the syndrome aggregator 170 of FIG. 1 prior to modifying the syndrome value for the C1 layer 0 check bit.

The variable group selector circuit 190 may select a first super-variable and a second super-variable for decode processing in parallel on the decoding paths 142-143. For example, the variable group selector circuit 190 may select the super-variables V5 and V6 as groups of variable nodes selected for concurrent processing 250. Although the super-variables V5 and V6 have interdependencies due to connections to super-check C3, the interdependencies are resolved by the syndrome aggregator 170.

Because multiple groups of variable nodes (e.g., multiple super-variables) may be processed concurrently with each other, decoding may be performed with reduced latency as compared to implementations where a single super-variable is processed at a time. Although FIG. 2 illustrates two super-variables selected for concurrent processing, more than two super-variables may be selected in implementations having more than two decoding paths 142-143. Increasing the number of super-variables that are concurrently processed decreases the latency of each decoding iteration and overall decoding time of the decoder.

Figure 3:
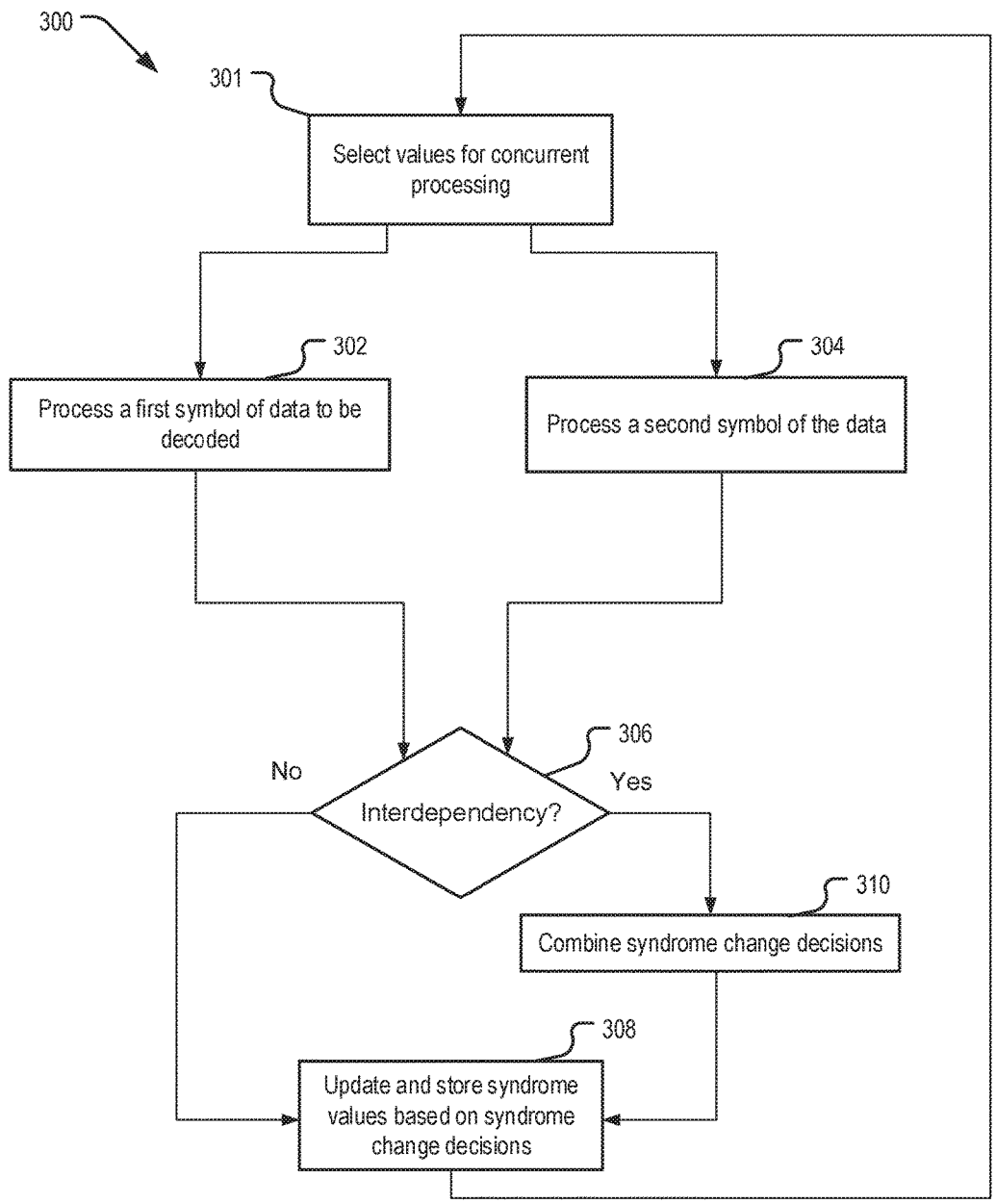
FIG. 3 is a flowchart of a particular illustrative example of a method of parallel ECC decoding that may be performed by the data storage device of FIG. 1.

Referring to FIG. 3, a particular illustrative example of a method of parallel ECC decoding is depicted and generally designated 300. The method 300 may be performed at an ECC decoder. For example, the ECC decoder may correspond to the ECC decoder 135 of FIG. 1.

The method 300 may include selecting values for concurrent processing, at 301. For example, a first variable node corresponding to data to be decoded and a second variable node corresponding to the data may be selected for concurrent processing. The first variable node may correspond to a first symbol of the data and the second variable node may correspond to a second symbol of the data. The first variable node and the second variable node may be selected via selection of groups of variable nodes as described with reference to the variable group selector circuit 190 of FIG. 1. For example, selecting the first variable node and the second variable node may be at least partially based on a first metric corresponding to an amount of interdependencies between variable nodes corresponding to the data. As another example, selecting the first variable node and the second variable node may be at least partially based on a second metric corresponding to a variable reliability measure of a variable node.

A first symbol of the data to be decoded is processed to generate a first syndrome change decision, at 302, and a second symbol of the data is processed substantially concurrently with processing the first symbol to generate a second syndrome change decision, at 304. For example, the first symbol may be processed at the first DPU 148 of FIG. 1 and the second symbol may be processed at the second DPU 149 of FIG. 1. The first symbol may correspond to a first group of variable nodes processed at the first decoding path 142 of FIG. 1 and the second symbol may correspond to a second group of variable nodes processed at the second decoding path 143 of FIG. 1. For example, each group of variable nodes may correspond to a block column of a QC-DLPC encoding scheme. A first number of variable nodes in the first group of variable nodes may correspond to a lifting factor of the QC-LDPC encoding scheme (e.g., number of variable nodes in the first group=Z), and a second number of variable nodes in the second group may also correspond to the lifting factor (e.g., number of variable nodes in the second group=Z).

At decision 306, a determination may be made as to whether an interdependency exists between the first symbol and the second symbol. For example, the syndrome aggregator 170 of FIG. 1 may determine whether any parity check equation of the encoding scheme includes the variable node corresponding to the first symbol and the variable node corresponding to the second symbol. If no interdependency exists between the first symbol and the second symbol, one or more syndrome values may be updated based on the syndrome change decisions and stored, at 308. For example, the syndrome values may be updated and stored at the syndrome memory 140 of FIG. 1.

If an interdependency exists between the first symbol and the second symbol, the first syndrome change decision and the second syndrome change decision are combined, at 310. For example, combining the first syndrome change decision and the second syndrome change decision may include performing a logical operation of a first syndrome change decision corresponding to the first symbol to change a particular syndrome and a second syndrome change decision corresponding to the second symbol to change the particular syndrome.

The combined syndrome change decision may be provided to a memory (e.g., the syndrome memory 140), where a syndrome value associated with the combined syndrome change decision may be updated and stored based on the combined change decision, at 308.

Although various components of the data storage device 102, such as the syndrome aggregator 170 and the variable group selector circuit 190 of FIG. 1 are depicted herein as block components and described in general terms, such components may include one or more physical components, such as hardware controllers, one or more microprocessors, state machines, logic circuits, one or more other structures, other circuits, or a combination thereof configured to enable the various components to perform operations described herein.

Components described herein may be operationally coupled to one another using one or more nodes, one or more buses (e.g., data buses and/or control buses), one or more other structures, or a combination thereof. One or more aspects of the various components may be implemented using a microprocessor or microcontroller programmed to perform operations described herein, such as one or more operations of the method 300 of FIG. 3.

Alternatively or in addition, one or more aspects of the data storage device 102, such as the syndrome aggregator 170 and/or the variable group selector circuit 190, may be implemented using a microprocessor or microcontroller programmed (e.g., by executing instructions) to perform operations described herein, such as one or more operations of the method 300 of FIG. 3. In some implementations, each of the controller 130, the memory device 103, and/or the access device 160 may include a processor executing instructions that are stored at a memory, such as a non-volatile memory of the data storage device 102 or of the access device 160 of FIG. 1. Alternatively or additionally, executable instructions that are executed by the processor may be stored at a separate memory location that is not part of the non-volatile memory, such as at a read-only memory (ROM) of the data storage device 102 or the access device 160 of FIG. 1.

Figure 4A:
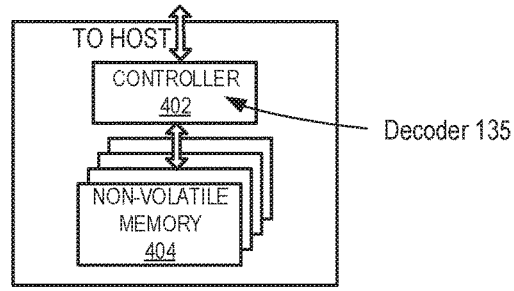
FIG. 4A is a block diagram of an illustrative example of a non-volatile memory system including a controller that includes the ECC decoder of FIG. 1.
Figure 4B:
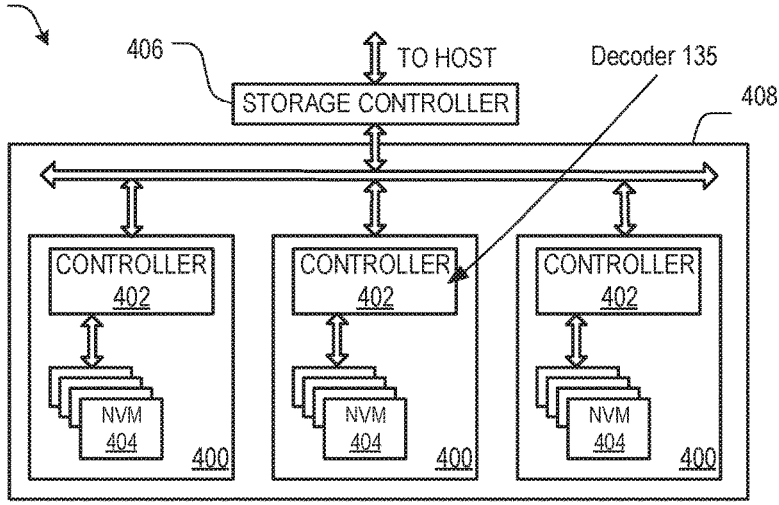
FIG. 4B is a block diagram of an illustrative example of a storage module that includes plural non-volatile memory systems that each may include the ECC decoder of FIG. 1.
Figure 4C:
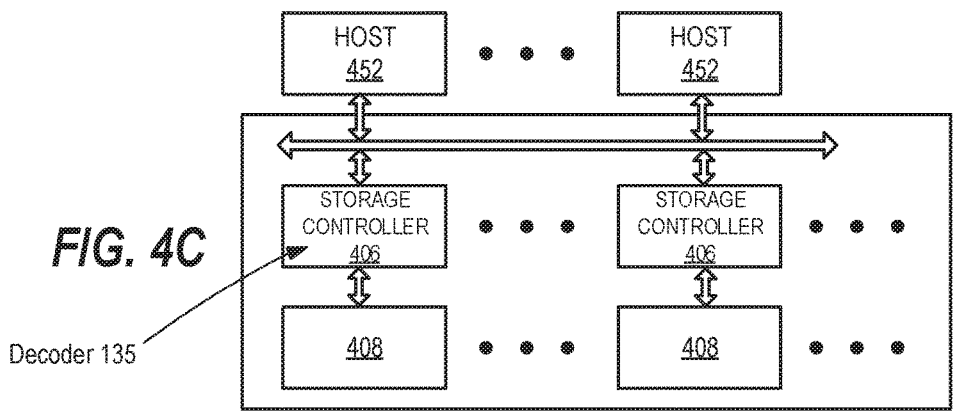
FIG. 4C is a block diagram of an illustrative example of a hierarchical storage system that includes a plurality of storage controllers that each may include the ECC decoder of FIG. 1.

Memory systems suitable for use in implementing aspects of the disclosure are shown in FIGS. 4A-4C. FIG. 4A is a block diagram illustrating a non-volatile memory system according to an example of the subject matter described herein. Referring to FIG. 4A, a non-volatile memory system 400 includes a controller 402 and non-volatile memory (e.g., the memory device 103 of FIG. 1) that may be made up of one or more non-volatile memory die 404. As used herein, the term "memory die" refers to the collection of non-volatile memory cells, and associated circuitry for managing the physical operation of those non-volatile memory cells, that are formed on a single semiconductor substrate. The controller 402 may correspond to the controller 130 of FIG. 1. Controller 402 interfaces with a host system (e.g., the access device 160 of FIG. 1) and transmits command sequences for read, program, and erase operations to non-volatile memory die 404. The controller 402 may include the decoder 135 of FIG. 1.

The controller 402 (which may be a flash memory controller) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 402 can be configured with hardware and/or firmware to perform the various functions described below and shown in the flow diagrams. Also, some of the components shown as being internal to the controller can be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory, map out bad flash memory cells, and allocate spare cells to be substituted for future failed cells. Some part of the spare cells can be used to hold firmware to operate the flash memory controller and implement other features. In operation, when a host is to read data from or write data to the flash memory, the host communicates with the flash memory controller. If the host provides a logical address to which data is to be read/written, the flash memory controller can convert the logical address received from the host to a physical address in the flash memory. (Alternatively, the host can provide the physical address.) The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 404 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 402 and non-volatile memory die 404 may be any suitable flash interface, such as Toggle Mode 200, 400, or 800. In one embodiment, non-volatile memory system 600 may be a card based system, such as a secure digital (SD) or a micro secure digital (micro-SD) card. In an alternate embodiment, memory system 400 may be part of an embedded memory system.

Although, in the example illustrated in FIG. 4A, non-volatile memory system 400 (sometimes referred to herein as a storage module) includes a single channel between controller 402 and non-volatile memory die 404, the subject matter described herein is not limited to having a single memory channel. For example, in some NAND memory system architectures (such as the ones shown in FIGS. 4B and 4C), 2, 4, 8 or more NAND channels may exist between the controller and the NAND memory device, depending on controller capabilities. In any of the embodiments described herein, more than a single channel may exist between the controller 402 and the non-volatile memory die 404, even if a single channel is shown in the drawings.

FIG. 4B illustrates a storage module 420 that includes plural non-volatile memory systems 400. As such, storage module 420 may include a storage controller 406 that interfaces with a host and with storage system 408, which includes a plurality of non-volatile memory systems 400. The interface between storage controller 406 and non-volatile memory systems 400 may be a bus interface, such as a serial advanced technology attachment (SATA) or peripheral component interface express (PCIe) interface. Storage module 420, in one embodiment, may be a solid state drive (SSD), such as found in portable computing devices, such as laptop computers, and tablet computers. Each controller 402 of FIG. 4B may include the decoder 135. Alternatively or in addition, the storage controller 406 may include the decoder 135.

FIG. 4C is a block diagram illustrating a hierarchical storage system. A hierarchical storage system 450 includes a plurality of storage controllers 406, each of which controls a respective storage system 408. Host systems 452 may access memories within the hierarchical storage system 450 via a bus interface. In one embodiment, the bus interface may be a Non-Volatile Memory Express (NVMe) or fiber channel over Ethernet (FCoE) interface. In one embodiment, the hierarchical storage system 450 illustrated in FIG. 4C may be a rack mountable mass storage system that is accessible by multiple host computers, such as would be found in a data center or other location where mass storage is needed. Each storage controller 406 of FIG. 4C may include the decoder 135.

Figure 5A:
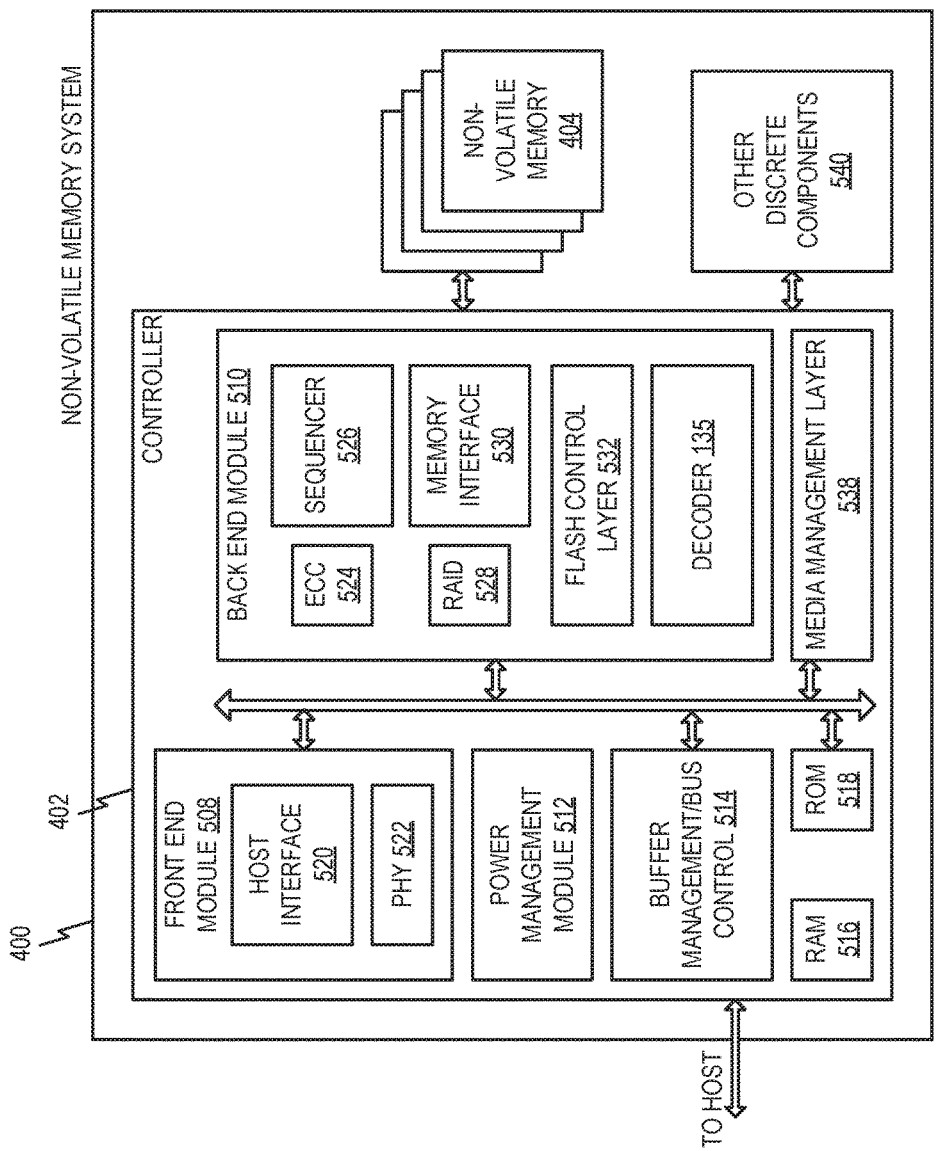
FIG. 5A is a block diagram illustrating an example of a non-volatile memory system including a controller that includes the ECC decoder of FIG. 1.

FIG. 5A is a block diagram illustrating exemplary components of the controller 402 in more detail. The controller 402 includes a front end module 508 that interfaces with a host, a back end module 510 that interfaces with the one or more non-volatile memory die 404, and various other modules that perform other functions. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Referring again to modules of the controller 402, a buffer manager/bus controller 514 manages buffers in random access memory (RAM) 516 and controls the internal bus arbitration of the controller 402. A read only memory (ROM) 518 stores system boot code. Although illustrated in FIG. 5A as located within the controller 402, in other embodiments one or both of the RAM 516 and the ROM 518 may be located externally to the controller 402. In yet other embodiments, portions of RAM and ROM may be located both within the controller 402 and outside the controller 402.

Front end module 508 includes a host interface 520 and a physical layer interface (PHY) 522 that provide the electrical interface with the host or next level storage controller. The choice of the type of host interface 520 can depend on the type of memory being used. Examples of host interfaces 520 include, but are not limited to, SATA, SATA Express, Serial Attached Small Computer System Interface (SAS), Fibre Channel, USB, PCIe, and NVMe. The host interface 520 typically facilitates transfer for data, control signals, and timing signals.

Back end module 510 includes an error correction code (ECC) engine 524 that encodes the data received from the host, and decodes and error corrects the data read from the non-volatile memory. A command sequencer 526 generates command sequences, such as program and erase command sequences, to be transmitted to non-volatile memory die 404. A RAID (Redundant Array of Independent Drives) module 528 manages generation of RAID parity and recovery of failed data. The RAID parity may be used as an additional level of integrity protection for the data being written into the non-volatile memory die 404. In some cases, the RAID module 528 may be a part of the ECC engine 524. A memory interface 530 provides the command sequences to non-volatile memory die 404 and receives status information from non-volatile memory die 404. For example, the memory interface 530 may be a double data rate (DDR) interface, such as a Toggle Mode 200, 400, or 800 interface. A flash control layer 532 controls the overall operation of back end module 510. The back end module 510 may also include the decoder 135.

Additional components of system 500 illustrated in FIG. 5A include a power management module 512 and a media management layer 538, which performs wear leveling of memory cells of non-volatile memory die 404. System 500 also includes other discrete components 540, such as external electrical interfaces, external RAM, resistors, capacitors, or other components that may interface with controller 402. In alternative embodiments, one or more of the physical layer interface 522, RAID module 528, media management layer 538 and buffer management/bus controller 514 are optional components that are omitted from the controller 402.

Figure 5B:
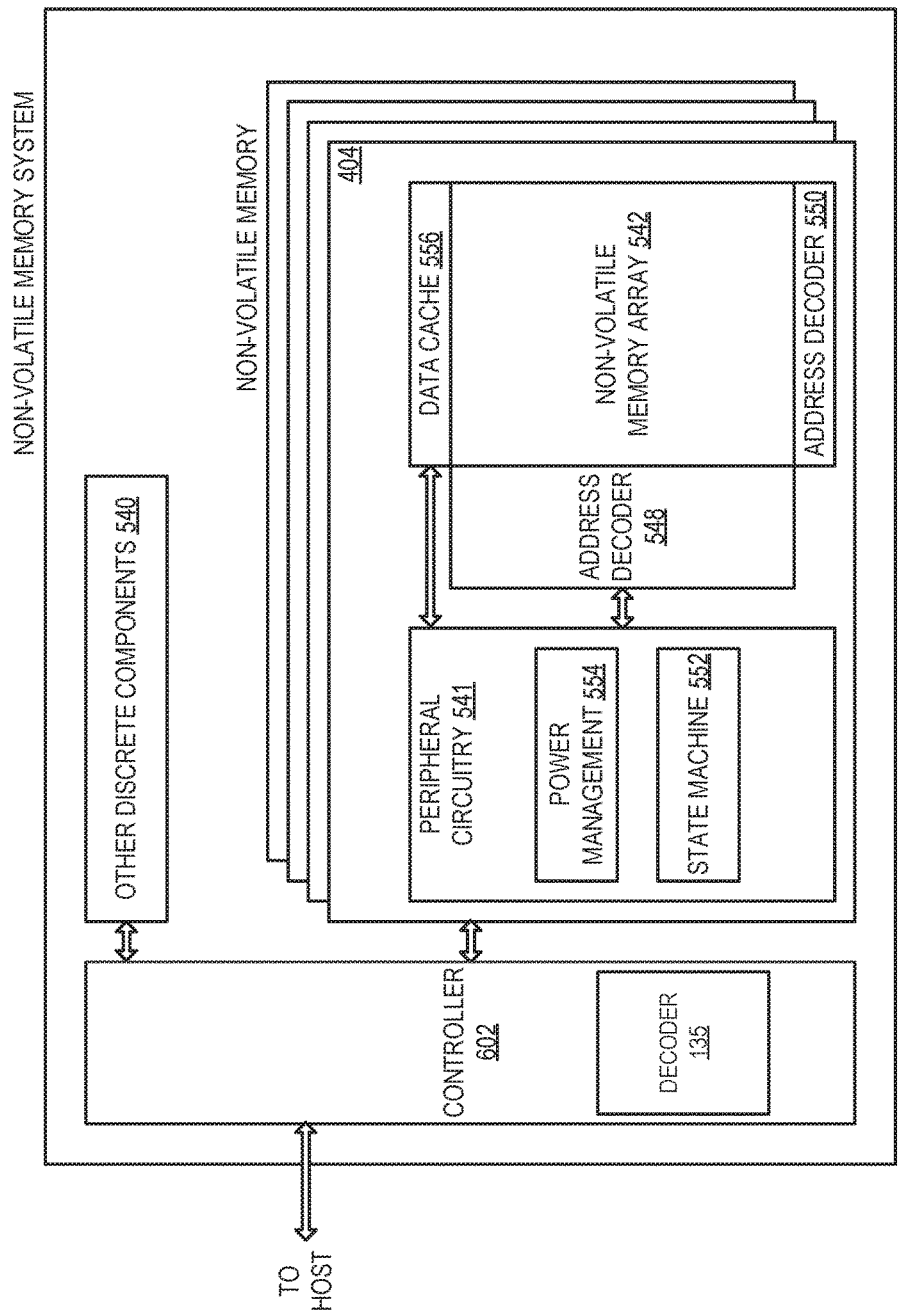
FIG. 5B is a block diagram illustrating exemplary components of a non-volatile memory die that may be coupled to a controller that includes the ECC decoder of FIG. 1.

FIG. 5B is a block diagram illustrating exemplary components of non-volatile memory die 404 in more detail. Non-volatile memory die 404 includes peripheral circuitry 541 and non-volatile memory array 542. Non-volatile memory array 542 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 541 includes a state machine 552 that provides status information to controller 402, which may include the decoder 135. The peripheral circuitry 541 may also include a power management or data latch control module 554. Non-volatile memory die 404 further includes discrete components 540, an address decoder 548, an address decoder 550, and a data cache 556 that caches data.

Semiconductor memory devices include volatile memory devices, such as dynamic random access memory ("DRAM") or static random access memory ("SRAM") devices, non-volatile memory devices, such as magnetoresistive random access memory ("MRAM"), resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some implementations include a resistivity switching storage element, such as an anti-fuse, phase change material, etc., and optionally a steering element, such as a diode, etc. Further by way of non-limiting example, active semiconductor memory elements include EEPROM and flash memory device elements, which in some implementations include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where they direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of a non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor material such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically used for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional illustrative structures described but cover all relevant memory structures within the scope of the disclosure as described herein and as understood by one of skill in the art. The illustrations of the examples described herein are intended to provide a general understanding of the various aspects of the disclosure. Other implementations may be utilized and derived from the disclosure, such that structural and logical substitutions and changes may be made without departing from the scope of the disclosure. This disclosure is intended to cover any and all subsequent adaptations or variations of various implementations. Those of skill in the art will recognize that such modifications are within the scope of the present disclosure.

The above-disclosed subject matter is to be considered illustrative, and not restrictive, and the appended claims are intended to cover all such modifications, enhancements, and other implementations, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A device comprising:
    a memory configured to store syndromes;
    a first data processing unit coupled to the memory and configured to process a first value corresponding to a first symbol of data to be decoded;
    a second data processing unit coupled to the memory and configured to process a second value corresponding to a second symbol of the data;
    syndrome aggregation circuitry coupled to the first data processing unit and to the second data processing unit, the syndrome aggregation circuitry configured to combine syndrome update results of the first data processing unit and the second data processing unit; and
    a variable group selector circuit configured to select a first variable node to be processed at the first data processing unit and a second variable node to be concurrently processed at the second data processing unit.

2. The device of claim 1, wherein the first data processing unit is configured to generate a first syndrome update result corresponding to the first symbol and wherein the second data processing unit is configured to generate a second syndrome update result corresponding to the second symbol.

3. The device of claim 1, wherein the syndrome aggregation circuitry is further configured to provide the combined syndrome update results to the memory via a syndrome update path.

4. The device of claim 1, further comprising:
    a first set of data processing units that includes the first data processing unit, wherein a first number of data processing units in the first set of data processing units corresponds to a lifting factor of a quasi-cyclic low density parity check (QC-LDPC) encoding scheme; and
    a second set of data processing units that includes the second data processing unit, wherein a second number of data processing units in the second set of data processing units corresponds to the lifting factor.

5. The device of claim 1, wherein the memory includes a flash memory and further comprising a controller coupled to the flash memory, the controller comprising the syndrome aggregation circuitry, the variable group selector circuit, the first data processing unit, and the second data processing unit.

6. The device of claim 1, wherein the variable group selector circuit is responsive to a first metric corresponding to an amount of interdependencies between variable nodes corresponding to the data.

7. The device of claim 1, wherein the variable group selector circuit is responsive to a second metric corresponding to a reliability measure of a variable node.

8. The device of claim 1, further comprising:
    first shifting circuitry coupled to the first data processing unit and configured to perform a first shift operation on first syndrome data received from the memory; and
    second shifting circuitry coupled to the second data processing unit and configured to perform a second shift operation on second syndrome data received from the memory.

9. The device of claim 1, further comprising:
third shifting circuitry coupled to the first data processing unit and to the syndrome aggregation circuitry; and
fourth shifting circuitry coupled to the second data processing unit and to the syndrome aggregation circuitry.

10. A data storage device comprising:
a non-volatile memory; and
a controller coupled to the non-volatile memory, the controller including an error correction coding (ECC) decoder including a first set of data processing units, a second set of data processing units, and a variable group selector circuit configured to select a first group of variable nodes to be processed at the first set of data processing units and a second group of variable nodes to be concurrently processed at the second set of data processing units during decoding of a representation of a codeword from the non-volatile memory, wherein the first group and the second group have at least one interdependency.

11. The data storage device of claim 10, wherein at least one syndrome of the codeword has a value that is determined based on at least a first variable node of the first group and at least a second variable node of the second group.

12. The data storage device of claim 10, wherein the variable group selector circuit is responsive to a first metric corresponding to an amount of interdependency between variable nodes corresponding to the data.

13. The data storage device of claim 10, wherein the variable group selector circuit is responsive to a second metric corresponding to a variable reliability measure of a variable node.

14. A method comprising:
at an error correction code (ECC) decoder including a variable group selector circuit, performing:
selecting, for concurrent processing, a first variable node corresponding to a first symbol of data to be decoded and a second variable node corresponding to a second symbol of the data, wherein selecting the first variable node and the second variable node is at least partially based on a first metric corresponding to an amount of interdependencies between variable nodes;
processing the first symbol to generate a first syndrome change decision;
processing the second symbol of the data to generate a second syndrome change decision; and
combining the first syndrome change decision and the second syndrome change decision.

15. The method of claim 14, wherein combining the first syndrome change decision and the second syndrome change decision includes performing a logical operation of the first syndrome change decision and the second syndrome change decision.

16. The method of claim 14, further comprising providing the combined syndrome change decision to a memory.

17. The method of claim 14, wherein the first symbol corresponds to a first group of variable nodes and the second symbol corresponds to a second group of variable nodes, wherein a first count of variable nodes in the first group of variable nodes corresponds to a lifting factor of a quasi-cyclic low density parity check (QC-LDPC) encoding scheme, and wherein a second count of variable nodes in the second group of variable nodes corresponds to the lifting factor.

18. The method of claim 17, further comprising performing a first shift operation on first syndrome data received from the memory.

19. The method of claim 14, further comprising updating and storing a syndrome value based on the combined syndrome change decision.

20. The method of claim 14, wherein selecting the first variable node and the second variable node is at least partially based on a second metric corresponding to a variable reliability measure of a variable node.

* * * * *